United States Patent
Pan

(10) Patent No.: US 9,065,485 B1
(45) Date of Patent: Jun. 23, 2015

(54) METHOD AND APPARATUS FOR INTERLEAVING USING STORED INITIAL VALUE

(75) Inventor: Zhengjun Pan, High Wycombe (GB)

(73) Assignee: Altera Corporation, San Jose, CA (US)

( * ) Notice: Subject to any disclaimer, the term of this patent is extended or adjusted under 35 U.S.C. 154(b) by 872 days.

(21) Appl. No.: 12/985,283

(22) Filed: Jan. 5, 2011
(Under 37 CFR 1.47)

(51) Int. Cl.
*H03M 13/27* (2006.01)
*G11C 7/10* (2006.01)

(52) U.S. Cl.
CPC ......... *H03M 13/2739* (2013.01); *G11C 7/1042* (2013.01)

(58) Field of Classification Search
USPC .......................................... 711/157; 714/756
See application file for complete search history.

(56) References Cited

U.S. PATENT DOCUMENTS

| | | | |
|---|---|---|---|
| 5,815,421 A | | 9/1998 | Dulong et al. |
| 6,163,871 A | * | 12/2000 | Yang .............................. 714/769 |
| 6,530,059 B1 | * | 3/2003 | Crozier et al. ................. 714/786 |
| 6,845,482 B2 | | 1/2005 | Yao et al. |
| 7,085,969 B2 | * | 8/2006 | Zheng et al. ................... 714/701 |
| 7,468,994 B2 | * | 12/2008 | Tsuchiya ....................... 370/539 |
| 7,667,628 B2 | | 2/2010 | Breiling |
| 8,291,291 B1 | * | 10/2012 | Pan et al. ....................... 714/756 |
| 2003/0182524 A1 | * | 9/2003 | Tsuchiya ....................... 711/157 |
| 2003/0221157 A1 | | 11/2003 | Becker et al. |
| 2010/0241922 A1 | * | 9/2010 | Furuhashi et al. ............. 714/752 |
| 2013/0311850 A1 | * | 11/2013 | Shinohara et al. ............. 714/758 |

OTHER PUBLICATIONS

U.S. Appl. No. 12/291,695, filed Nov. 13, 2008, Pan et al.
Cheng, M. "A Decoder Architecture for High-Speed Free-Space Laser Communications," Proceedings of SPIE, Apr. 2005, vol. 5712, pp. 174-185.

* cited by examiner

*Primary Examiner* — Mardochee Chery
(74) *Attorney, Agent, or Firm* — Mauriel Kapouytian Woods LLP; Ararat Kapouytian

(57) ABSTRACT

An interleaver and method for interleaving are provided, where initialization values are pre-calculated and stored in memory. In one implementation, the method of interleaving includes: calculating in advance an initial value of at least one parameter for use by logic circuitry to initialize interleaving operation; storing the initial value of the at least one parameter as a stored initial value of the at least one parameter; and using the stored initial value of the at least one parameter with the logic circuitry to generate interleaved order positions for the set of data items. In one implementation, the interleaver includes: logic circuitry for generating interleaved order positions for the set of data items and memory coupled to the logic circuitry for holding an initial value of at least one parameter for use by the logic circuitry to initialize interleaving operation.

16 Claims, 9 Drawing Sheets

METHOD AND APPARATUS FOR INTERLEAVING USING STORED INITIAL VALUE

BACKGROUND

Interleaving is used to help signal receivers overcome errors in acquired signals. For example, interleaving is applied to signals that are sent in wireless telecommunications networks that comply with the Third Generation Partnership Program (3GPP) standards.

Generally speaking, interleaving, as performed by an interleaver, is the deliberate and reversible disordering of a sequence of information symbols. If a receiver acquires an interleaved signal in which an error affects a contiguous group of symbols, the error can be dispersed by reversing the interleaving, so-called "deinterleaving."

The ability to disperse an error is important when a transmitted information symbol sequence is prepared using forward error correction (FEC) coding that enables the resolution of an error in an acquired sequence provided that the error does not extend over too great a contiguous part of the acquired sequence. Turbo encoding is an example of FEC that is used within the 3GPP standards.

In a turbo encoder, a symbol sequence is supplied in parallel to both a first convolutional encoder and an interleaver. The interleaver produces an interleaved version of the sequence, which is then input to a second convolutional encoder. The outputs of the convolutional encoders are combined with the original sequence to provide the output of the turbo encoder. In a turbo decoder, a received turbo encoded sequence is used to prime a pair of constituent decoders. The output of a first one of the constituent decoders is interleaved and sent to the second constituent decoder for a further decoding iteration and the output of the second constituent decoder is deinterleaved and sent to the first constituent decoder for a further decoding iteration. The outputs of the first and second constituent decoders are exchanged several times prior to the emergence of a finally decoded sequence. Thus, where turbo coding is employed, considerable processing effort is devoted to interleaving, particularly in turbo decoding.

Several classes of interleaving algorithm exist. For example, a rectangular interleaver loads a symbol sequence into a memory block in a column-wise fashion and reads the symbols out in a row-wise fashion. Another type of interleaving is quadratic permutation polynomial (QPP) interleaving, which will be discussed after a brief reminder regarding some mathematical operations that feature in the remainder of this document:

the operation A mod B returns the remainder part of A divided by B.

the floor function/operation $\lfloor C \rfloor$ returns the largest integer value that is less than C.

Given a data sequence of length K symbols (where K has an integer value) and two parameters a and b that are dependent on K), the relationship between the position x of a symbol in the interleaved sequence and its position f(x) in the original sequence of QPP interleaving is:

$$f(x)=(ax+bx^2)\bmod K \qquad \text{Equation 1}$$

where x=0, 1, 2, 3, 4, . . . , K−1.

It has been shown in "A Decoder Architecture for High-Speed Free-Space Laser Communications" (M. Cheng, M. Nakashima, J. Hamkins, B. Moision, and M. Barsoum, Proceedings of SPIE, vol. 5712, pp. 174-185, April 2005) that if we define:

$$g(x)=(a+b+2bx)\bmod K$$

then:

$$f(x+1)=(f(x)+g(x))\bmod K$$

and $$g(x+1)=(g(x)+2b)\bmod K$$

The function g(x) is an auxiliary function that recursively defines f(x).

SUMMARY

According to one aspect, an embodiment of the invention provides a method of interleaving a set of data items from an original order to an interleaved order. The method includes calculating in advance an initial value of at least one parameter for use by logic circuitry to initialize interleaving operation, storing the initial value of at least one parameter, and using the stored initial value of at least one parameter with the logic circuitry to generate interleaved order positions for the set of data items.

The at least one parameter may include a plurality of sets of parameters for a plurality of respective block sizes of the set of data items. The logic circuitry may include a single processing engine and the at least one parameter includes a first parameter having a value represented by (a+b)mod K and a second parameter having a value represented by (2b)mod K, where K represents block size in the set of data items, and a and b represent coefficients of a quadratic permutation polynomial (QPP) determining the interleaved order from the original order.

It is appreciated that the at least one parameter may include a third and a fourth parameter. Accordingly, the logic circuitry may further include registered inputs arranged to receive the third parameter value represented by c−K and the fourth parameter value represented by c−2K, where c represents (2b)mod K.

In an alternative embodiment, the logic circuitry includes a plurality of processing engines and the at least one parameter includes a first, a second, a third, and a fourth parameter. The first parameter may have a value represented by (a+b)mod M, a second parameter may have a value represented by $\lfloor (a+b)/M \rfloor$, a third parameter may have a value represented by (2b) mod M, and a fourth parameter may have a value represented by $\lfloor (2b)/M \rfloor$, where a and b represent coefficients of a QPP determining the interleaved order from the original order. According to one embodiment, M represents length of sections into which the set of data items is divided for processing by the plurality of engines, and $\lfloor \ \rfloor$ denotes floor function.

The logic circuitry may include a plurality of processing engines whose operation is synchronized, the set of data items can be visualized respectively as a rectangular array of data items with rows and columns. The interleaver includes a single logic assembly arranged to calculate both column addresses and row addresses.

The logic circuitry may alternatively include a plurality of processing engines and the at least one parameter may include a first parameter having a value represented by (a+b) mod M, (c−M)mod M, (c−2M)mod M, $\lfloor (a+b)/M \rfloor$, where a and b represent coefficients of a QPP determining the interleaved order from the original order. In one embodiment, M represents length of sections into which the set of data items is divided for processing by the plurality of engines. The logic circuitry may include a Single-Input and Single-Output (SISO) decoder.

According to a further aspect, an embodiment of the present invention provides an interleaver, for interleaving a set of data items from an original order to an interleaved order, the interleaver including: logic circuitry for generating interleaved order positions for the set of data items, and memory coupled to the logic circuitry for holding an initial value of at least one parameter for use by the logic circuitry to initialize interleaving operation. The at least one parameter may include a plurality of sets of parameters for a plurality of respective block sizes of the set of data items. The interleaver may include a single processing engine and the at least one parameter includes a first parameter having a value represented by (a+b)mod K and a second parameter having a value represented by (2b)mod K, where K represents block size in the set of data items, and a and b represent coefficients of a QPP determining the interleaved order from the original order.

According to one embodiment, the at least one parameter may further include a third and a fourth parameter. Accordingly, the interleaver may further include registered inputs arranged to receive the third parameter value represented by c−K and the fourth parameter value represented by c−2K, where c represents (2b)mod K. In an alternative embodiment, the interleaver includes a plurality of processing engines and the at least one parameter includes a first parameter having a value represented by (a+b)mod M, a second parameter having a value represented by $\lfloor(a+b)/M\rfloor$, a third parameter having a value represented by (2b)mod M, and a fourth parameter having a value represented by $\lfloor(2b)/M\rfloor$, where a and b represent coefficients of a QPP determining the interleaved order from the original order, and M represents length of sections into which the set of data items is divided for processing by the plurality of engines.

The interleaver may includes a plurality of processing engines whose operation is synchronized. It is appreciated that the set of data items may be visualized respectively as a rectangular array of data items with rows and columns, and the interleaver may include a single logic assembly arranged to calculate both column addresses and row addresses.

The interleaver may alternatively include a plurality of processing engines and the at least one parameter includes a first parameter having a value represented by (a+b)mod M, (c−M)mod M, (c−2M)mod M, $\lfloor(a+b)/M\rfloor$, where a and b represent coefficients of a QPP determining the interleaved order from the original order, and M represents length of sections into which the set of data items is divided for processing by the plurality of engines. The interleaver may include a SISO decoder.

According to a yet further aspect, an embodiment of the invention provides a method of interleaving a series of K data items from an original order to an interleaved order. The method includes: calculating from which position in the original order should be provided the data item for a current position in the interleaved order; where: the series of K data items represents communication signals (where K is an integer); the position in the original order is specified by a first function, which is a function of the current position in the interleaved order; the basis of the first function is a sum of two variable values each being less than K; a first of said variable values is the value of the first function when its argument is the preceding position in the interleaved order; a second of the variable values is the value of an auxiliary function when its argument is the preceding position in the interleaved order; and the method further includes: storing an initial value of at least one parameter; using the stored an initial value of at least one parameter to initialize interleaving operation; calculating a first sum, which is a sum of the first variable value and a first constant; calculating a second sum, which is a sum of the second variable value and a second constant; and using the first and second sums to calculate a value for the auxiliary function when its argument is the current position in the interleaved order; where the first and second sums are calculated in parallel by logic circuitry.

According to still a further aspect, an embodiment of the invention provides an interleaver for interleaving a series of K data items from an original order to an interleaved order, where: the interleaver is arranged to calculate from which position in the original order should be provided the data item for a current position in the interleaved order; the position in the original order is specified by a first function, which is a function of the current position in the interleaved order; the basis of the first function is a sum of two variable values each being less than K; a first of said variable values is the value of the first function when its argument is the preceding position in the interleaved order; a second of said variable values is the value of an auxiliary function when its argument is the preceding position in the interleaved order; and the interleaver includes: memory for holding an initial value of at least one parameter for use to initialize interleaving operation; first logic circuitry arranged to calculate a first sum, which is a sum of the first variable value and a first constant; second logic circuitry arranged to calculate a second sum, which is a sum of the second variable value and a second constant; and third logic circuitry arranged to use said first and second sums to calculate a value for the auxiliary function when its argument is the current position in the interleaved order; where the first and second logic circuitry are arranged to operate in parallel.

Thus, embodiments of the invention parallelize loading, thereby reducing overall system latency and improving throughput. There is no need to calculate interleaver addresses sequentially, which saves hardware resources. There is also no requirement for extra logic circuitry resources to store the sequence values in a memory. The interleaver addresses can be calculated in a SISO decoder. As a result, a single buffer is needed, hence saving memory bits. Accordingly, using embodiments of the present invention, decoders such as a Long Term Evolution (LTE) Turbo decoders are made more effective in terms of hardware and performance.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable a person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
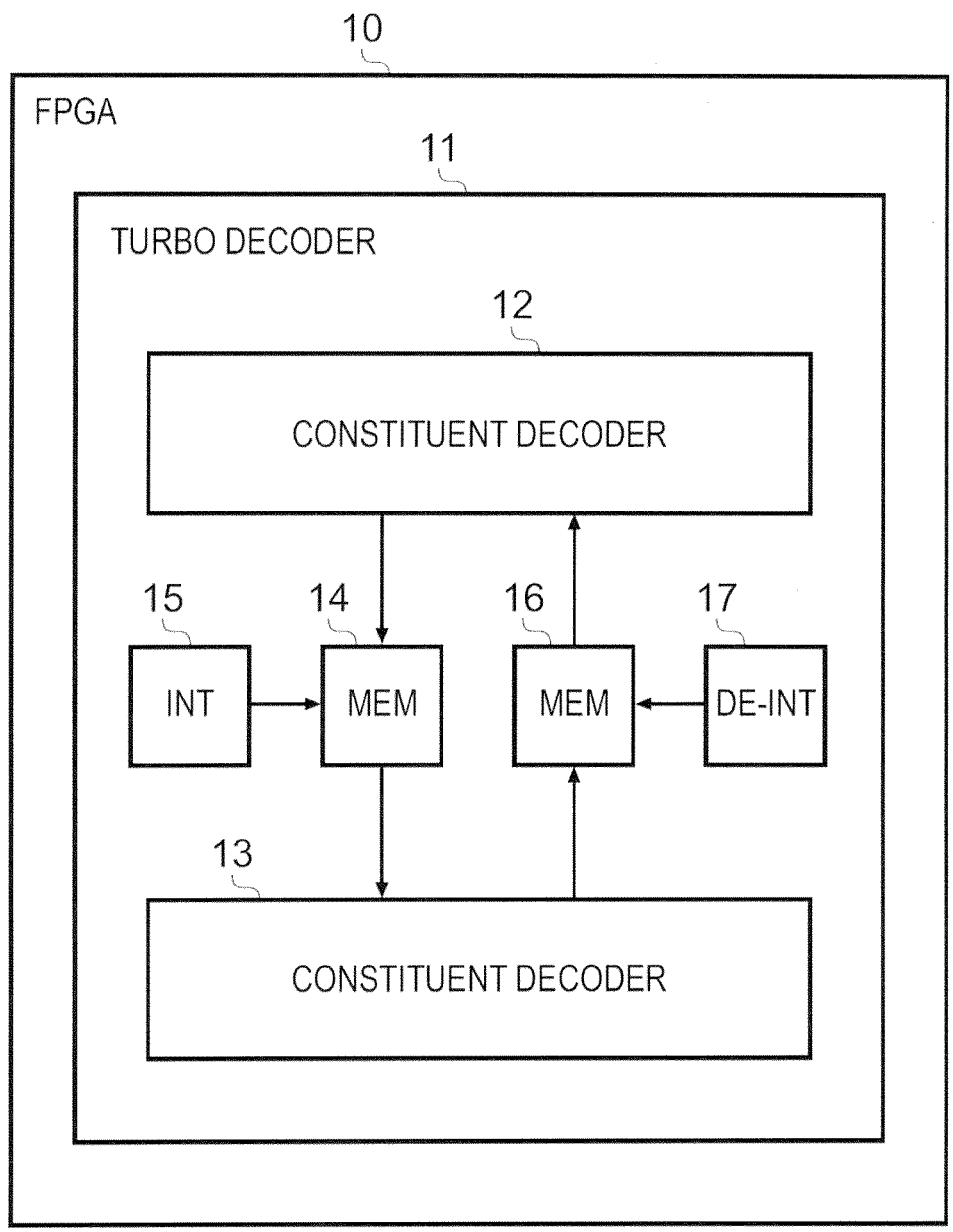
FIG. 1 is an exemplary block diagram schematically illustrating a field programmable gate array (FPGA) for implementing a turbo decoder design in accordance with one embodiment of the present invention.

FIG. 1 is an exemplary block diagram schematically illustrating an FPGA for implementing a turbo decoder design in accordance with one embodiment of the present invention. In one embodiment, FPGA 10 (shown in FIG. 1) forms part of a base station (not shown) of a 3GPP LTE network. A turbo decoder 11 is implemented in the FPGA 10 for turbo decoding encoded signals that have been demodulated from RF signals received by the base station. Although embodiments of the present invention are described in the context of FPGA 10, it is to be noted that embodiments of the present invention more generally apply in the context of integrated circuits (ICs), such as FPGAs, application specific ICs (ASICs), or any other type of ICs. One or more portions of an IC, such as an FPGA, may herein be referred to as logic circuitry.

Turbo decoder 11 may include first and second constituent decoders 12 and 13, each arranged to work on the re-ordered output of the other. The output sequence that constituent decoder 12 produces during an iteration of the turbo decoding process is stored into a memory 14. That sequence is then read from the memory 14 under the control of an interleaver 15 in order to provide the input sequence for constituent decoder 13 in the next iteration of the turbo decoding process. In a similar manner, the output sequence that constituent decoder 13 produces during an iteration of the turbo decoding process is stored into a memory 16. That sequence is then read from the memory 16 under the control of a deinterleaver 17 in order to provide the input to constituent decoder 12 for the next iteration of the turbo decoding process.

The sequence loaded into memory 14 from constituent decoder 12 arrives in memory 14 in a certain order, which shall hereinafter be referred to as the "original order." The sequence loaded into memory 14 is then read out from memory 14 in a different order than the "original order," which shall hereinafter be called the "interleaved order," in accordance with a QPP interleaving algorithm (the deinterleaver 17 applies the reverse of this reordering operation). The interleaved order is obtained from the original order using the QPP interleaving algorithm mentioned earlier, in the "Background" section. That is to say, where the sequence to be interleaved is a block of K symbols, the relationship between the position x of a symbol in an original order and its position f(x) in the interleaved order is:

$$f(x)=(ax+bx^2) \bmod K$$

where:

$x=0, 1, 2, 3, 4, \ldots, K-1$; and a and b are dependent on K.

According to the aforementioned paper by Cheng et al, position $f(x-1)$ can be deduced from position $f(x)$ by:

$$f(x+1)=(f(x)+g(x)) \bmod K$$

where:

$$g(x)=(a+b+2bx) \bmod K;$$

$$g(x+1)=(g(x)+2b) \bmod K; \text{ and}$$

the initial conditions are $f(0)=0$ and $g(0)=(a+b) \bmod K$.

Figure 2:
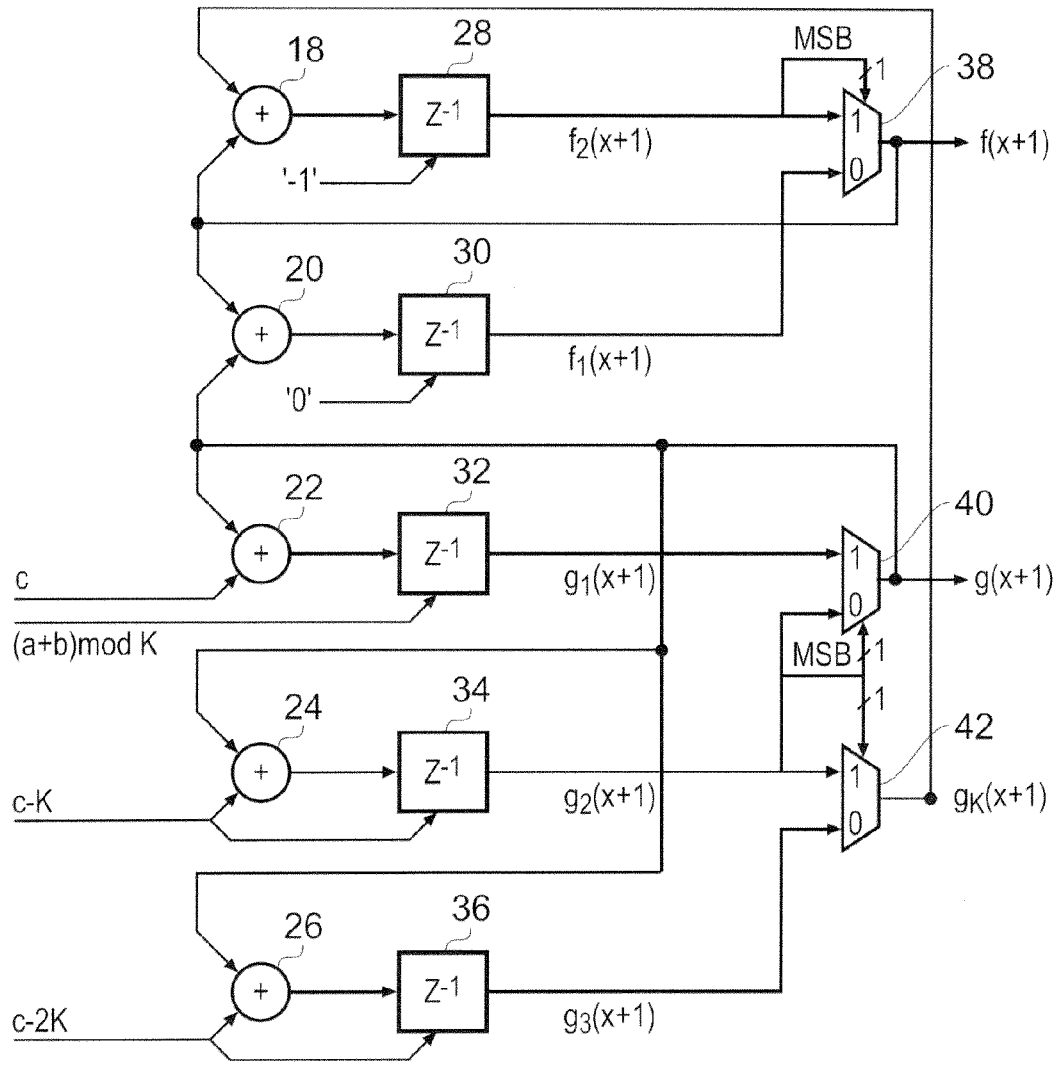
FIG. 2 illustrates an exemplary schematic of the hardware that is implemented within the FPGA of FIG. 1 associated with the interleaver in accordance with one embodiment of the present invention.

An exemplary hardware implementation of the interleaver 15, in accordance with one embodiment of the present invention, that deduces $f(x+1)$ from $f(x)$ and $g(x)$ and which also deduces $g(x+1)$ is shown in FIG. 2. The reasoning for the creation of that implementation is discussed before describing the implementation itself.

First, $c=2b \bmod K$ may be defined in one exemplary embodiment. The following values can be calculated:

$$f_1(x+1)=f(x)+g(x)$$

$$f_2(x+1)=f(x)+g(x)-K$$

$$g_1(x+1)=g(x)+c$$

$$g_2(x+1)=g(x)+c-K.$$

Since $f(x)=(ax+bx^2) \bmod K$, it follows that $f(x)<K$. Since $g(x)=(a+b+2bx) \bmod K$, it follows that $g(x)<K$. Also, it is appreciated that $c<K$. Therefore:

either $f_1(x+1)$ or $f_2(x+1)$ is less than K; and either $g_1(x+1)$ or $g_2(x+1)$ is less than K.

More formally:

$$f(x+1) = \begin{cases} f_1(x+1) & \text{if } f_1(x+1) < K \\ f_2(x+1) & \text{else} \end{cases} \quad \text{Equation 2}$$

$$g(x+1) = \begin{cases} g_1(x+1) & \text{if } g_1(x+1) < K \\ g_1(x+1) & \text{else} \end{cases} \quad \text{Equation 3}$$

Thus, the FPGA 10 can be configured to implement the calculation of the values $f_1(x+1)$, $f_2(x+1)$, $g_1(x+1)$ and $g_2(x+1)$ and to evaluation of Equations 2 and 3, without performing the multiplication and division operations that appear to be required by Equation 1.

The hardware implementation for the calculation of $f(x+1)$ that is shown in FIG. 2 is more efficient in that it not only avoids the multiplication and division operations of Equation 1 but it also avoids undesirable data path delays that may arise from locating several arithmetic operations in series in a data path.

The digital circuit shown in FIG. 2 contains five adders 18 to 26, five registers 28 to 36 and three multiplexers 38 to 42, these elements being interconnected as shown in the diagram. One input of adder 22 is supplied with the value c, one input of the adder 24 is supplied with the value c−K, and one input of adder 26 is supplied with the value c−2K. The other inputs of the adders 18 to 26 are supplied by feedback paths. At the initialization stage, the registers 28 to 36 are respectively loaded with values −1, 0, (a+b)mod K, c−K and c−2K (these last three values and, indeed, the value c all being precalculated). These initial values are loaded using the synchronous load inputs of the registers 28 to 36, as indicated by the inputs leading into the lower faces of the registers. The control signal for multiplexer 38 is the most significant bit (MSB) of the output of register 28, whilst the MSB of the output of register 34 provides the control signal for both multiplexer 40 and multiplexer 42. The mathematical operations performed in the circuit of FIG. 2 will now be described.

The circuit of FIG. 2 calculates the following values:

$$f_1(x+1) = f(x) + g(x)$$

which is the output of register 30.

$$f_2(x+1) = f(x) + g_K(x)$$

which is the output of register 28.

$$g_1(x+1) = g(x)$$

which is the output of register 32.

$$g_2(x+1) = g(x) + c - K$$

which is the output of register 34.

$$g_3(x+1) = g(x) + c - 2K$$

which is the output of register 36.

The values for f(x+1) and g(x+1) appear at the outputs of multiplexers 38 and 40, respectively.

Note that the definition of $f_2$ has been modified and that $g_3$ and $g_K$ have been introduced. The value $g_K$ appears at the output of the multiplexer 42 and is given by:

$$g_K(x+1) = \begin{cases} g_2(x+1) & \text{if } g_2(x+1) < K \\ g_3(x+1) & \text{if } g_2(x+1) \geq K. \end{cases}$$

These changes avoid the "double addition" in f(x)+g(x)−K, which was the original formulation for f(x+1).

Figure 3:
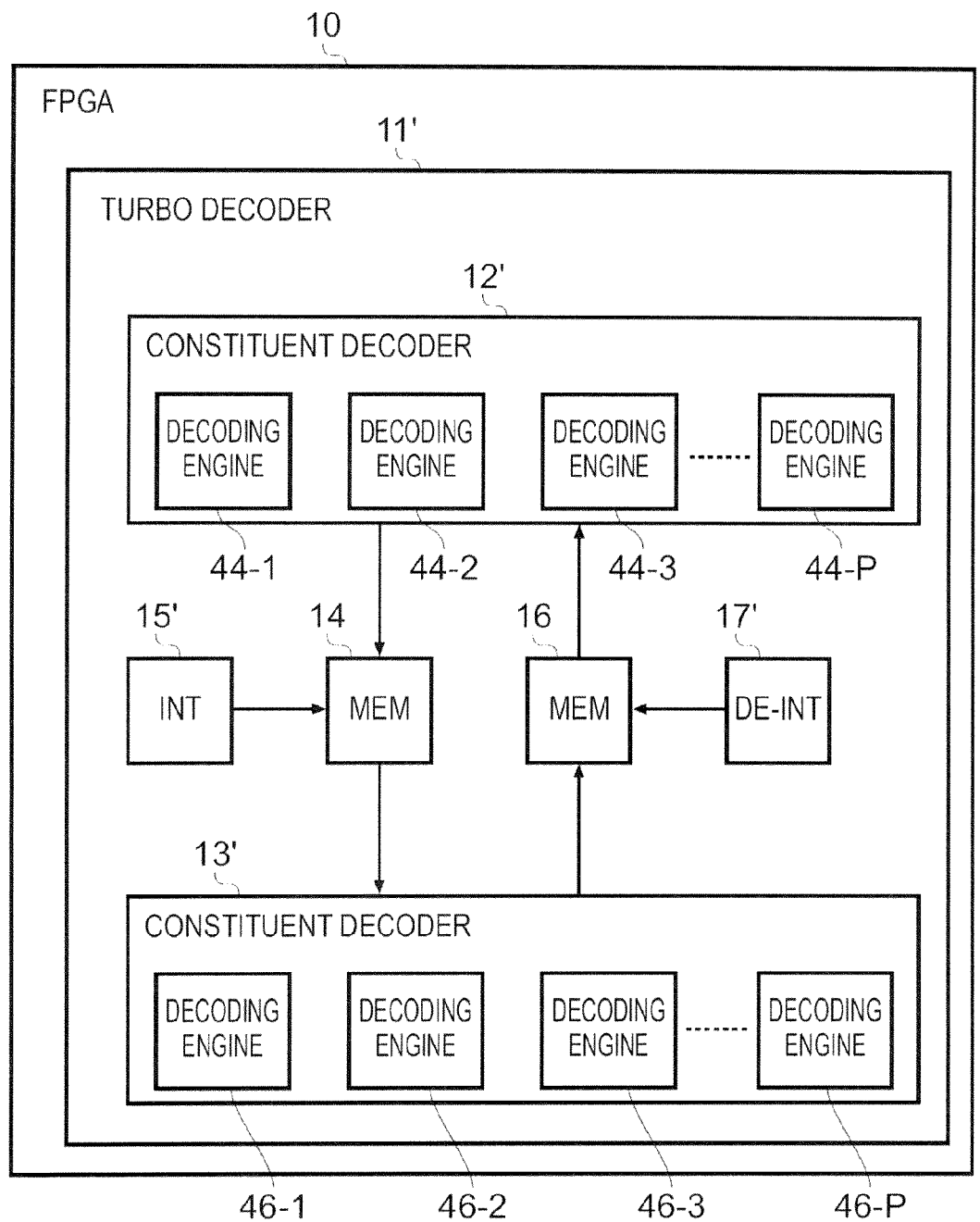
FIG. 3 is an exemplary block diagram illustrating the implementation of one type of turbo decoder design within an FPGA in accordance with one embodiment of the present invention.

A deinterleaver adapted to support a parallel block decoding within a turbo decoder will now be described, with reference to FIGS. 3 and 4.

A sequence of symbols to be decoded by a constituent decoder (such as 12 or 13 in FIG. 1) in a turbo decoding iteration can be divided into sections such that each section can be decoded separately. Typically, such sections are decoded in parallel by respective decoding engines to achieve a significant decrease in the time required to decode the entire sequence. FIG. 3 illustrates an exemplary implementation of a modified turbo decoder 11' in the FPGA 10. Turbo decoder 11' differs from turbo decoder 11 in terms of the nature of the constituent decoders and the associated interleaver and deinterleaver.

The constituent decoder 12' contains P parallel decoding engines 44-1 to 44-P (where P has an integer value), each for decoding a section of the deinterleaved version of the sequence produced by the deinterleaver 17' reading from memory 16 the sequence produced by constituent decoder 13' in the previous turbo decoding iteration. The constituent decoder 13' contains P parallel decoding engines 46-1 to 46-P, each for decoding a section of the interleaved version of the sequence produced by the interleaver 15' reading from memory 14 the sequence produced by the constituent decoder 12' in the previous turbo decoding iteration. In reading symbols from memory 14, the interleaver 15' implements a version of QPP interleaving that supplies decoding engines 46-1 to 46-P in parallel with the sequence sections that they are to decode (and the deinterleaver 17' performs an analogous deinterleaving role for engines 44-1 to 44-P). As a precursor to describing the operation of the interleaver 15', a nomenclature for describing the arrangement of the symbols that are provided to the engines 44-1 to 44-P and 46-1 to 46-P will now be developed.

Figure 4:
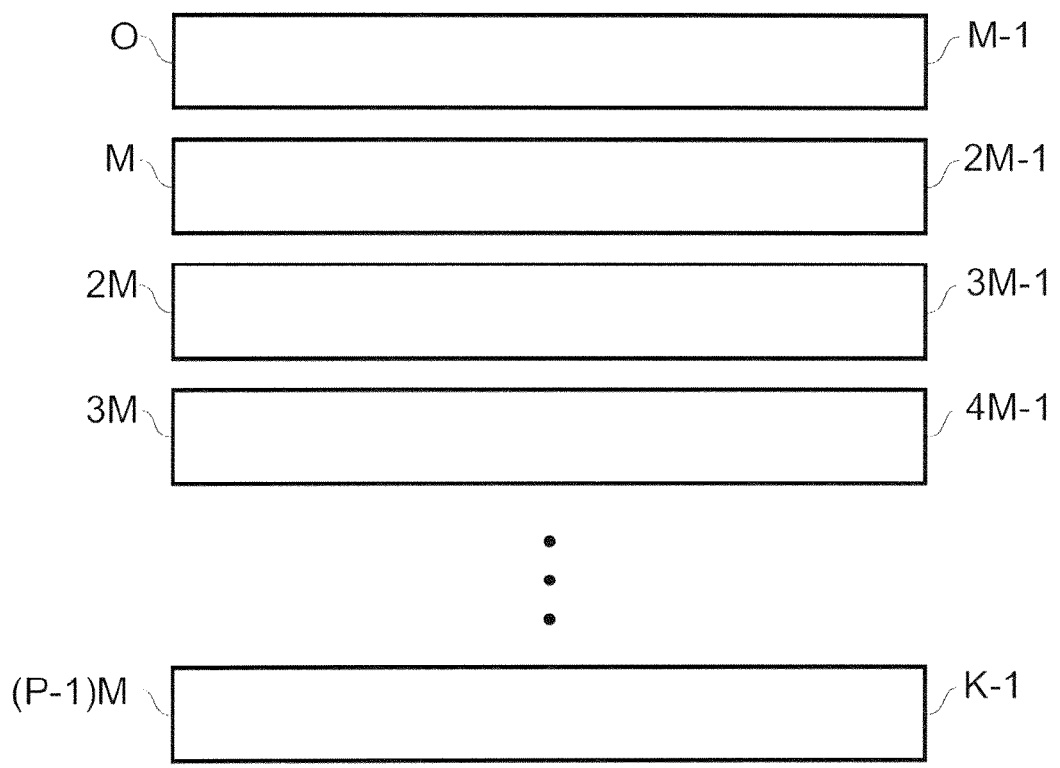
FIG. 4 illustrates an exemplary reformatting of a signal sequence as an array in accordance with one embodiment of the present invention.

FIG. 4 shows an exemplary sequence of length K symbols divided into P sections, each of length M(=K/P) symbols (where M has an integer value), each section to be processed by a different one of engines 46-1 to 46-P. The first section consists of symbols 0 to M−1 from the sequence, the second section consists of symbols M to 2M−1 from the sequence, the third section consists of symbols 2M to 3M−1 from the sequence, and so on. In FIG. 4, the sections are arranged one below the other to form a two dimensional array of symbols, having both rows (running horizontally) and columns (running vertically). Each of the symbols in this array can be addressed by its row and column position.

Figure 5:
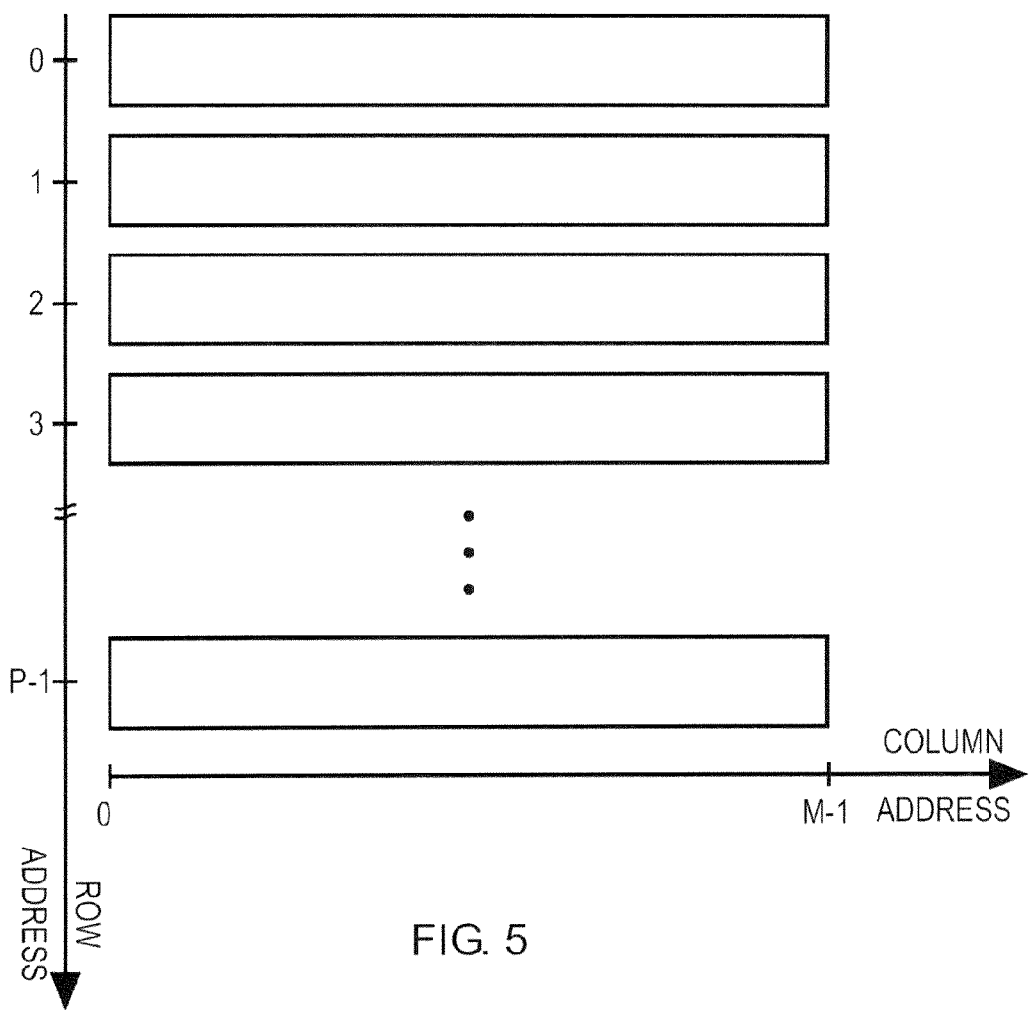
FIG. 5 shows an exemplary application of a column and row addressing scheme to the array of FIG. 4 in accordance with one embodiment of the present invention.

FIG. 5 shows the same array of symbols, but now each symbol in the array is addressed by its row and column positions hereinafter called its "row address" and its "column address," respectively). For example, all symbols in the section running from symbol 0 to symbol M−1 have the row address 0 and all symbols in the section running from symbol 3M to 4M−1 have the row address 3. The first symbols of the sections all have the column address 0, the second symbols have the column address 1, the third symbols have the column address 2, and so on until the final symbols of the sections are reached, which all share the column address M−1.

Figure 6:
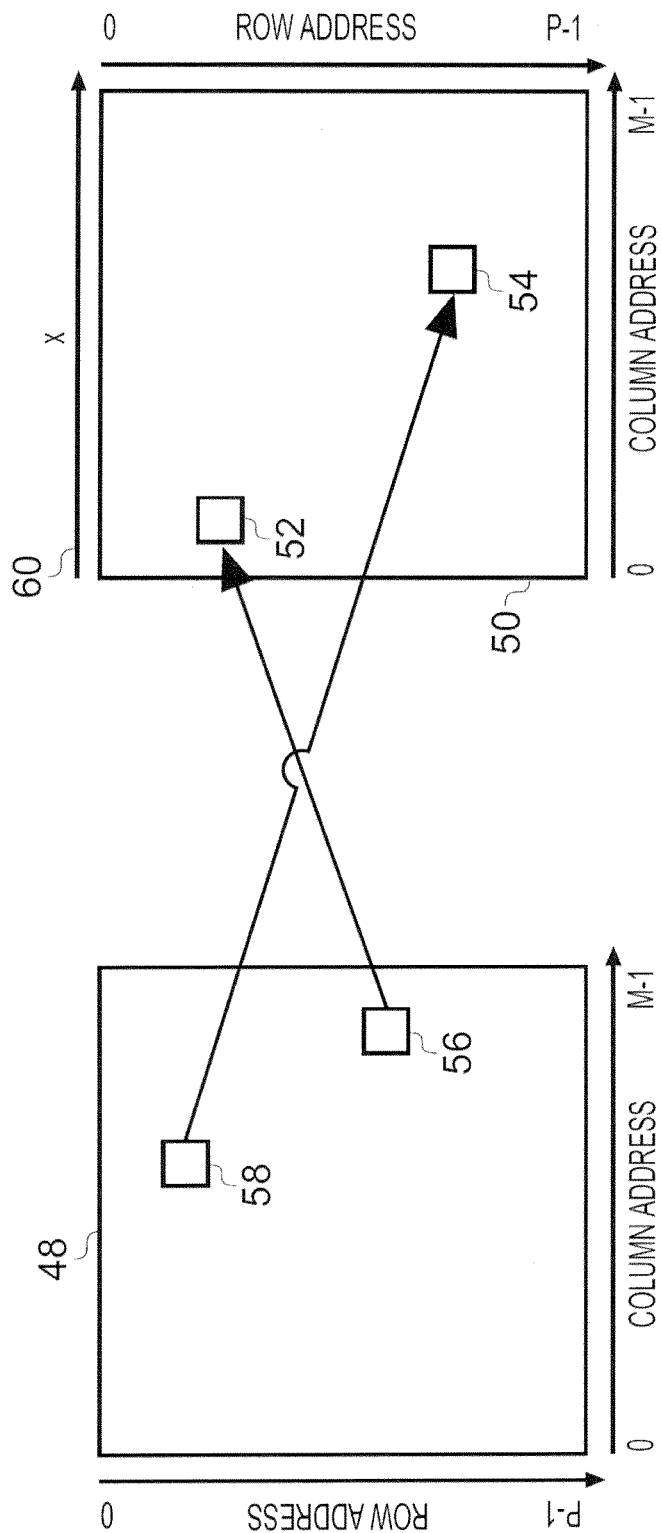
FIG. 6 illustrates an exemplary interleaving of an array formatted signal in accordance with one embodiment of the present invention.

Over the course of a turbo decoding iteration, each of the engines 44-1 to 44-P produces an estimate of a section of the original order. These sections are shown in FIG. 6 formed into an array 48, whose elements are subject to the addressing scheme developed in FIG. 5. Accordingly, each row in array 48 is the output of a respective one of the decoding engines 44-1 to 44-P. The data that populates this array is stored in memory 14. The content of that memory are read out as sections of the interleaved order with each section being directed to a respective one of the parallel decoding engines 46-1 to 46-P. The sections of the interleaved order can likewise be formed into an array 50, again addressed using the convention developed in FIG. 5. The interleaver 15' may place the contents of the array 48 at their appropriate positions in the array 50 (and the deinterleaver 17' performs an analogous role for the data that needs to be read out of memory 16 for engines 44-1 to 44-P). Consider, for example, elements 52 and 54 in array 50, and assume that they lie in rows of array 50 corresponding to the sections that are input to engines 46-$a$ and 46-$b$ respectively. When the interleaver 15' supplies the content of element 52 to engine 46-$a$, the interleaver 15' supplies the content of the element of array 48 that is specified by the QPP interleaving algorithm, in this instance element 56. Likewise, when the interleaver 15' supplies the content of element 54 to engine 46-$b$, the interleaver 15' supplies the content of the element that is specified by the QPP interleaving algorithm, on this occasion element 58.

According to the QPP algorithm set out earlier, the content for position x in the interleaved sequence is obtained from position f(x) in the original sequence. Given that the original sequence is now arranged as array 48 in FIG. 6, position f(x) can be expressed by co-ordinates consisting of a column address f'(x) and a row address f''(x) where:

$$f'(x) = f(x) \bmod m \quad \quad \text{Equation 4}$$

$$f''(x) = \lfloor f(x)/M \rfloor \quad \quad \text{Equation 5.}$$

This can be stated another way as:

$$f(x)=f'(x)+Mf''(x) \quad \text{Equation 6}$$

We can define a similar decomposition for g(x):

$$g(x)=g'(x)+Mg''(x) \quad \text{Equation 7}$$

where:

$$g'(x)=g(x) \bmod M \quad \text{Equation 8}$$

$$g''(x)=\lfloor g(x)/M \rfloor \quad \text{Equation 9}$$

where g'(x) and g''(x) are auxiliary functions too.
Given that $f'(x+1)=f(x+1) \bmod M$, we can substitute for $f(x+1)$ to obtain:

$$f'(x+1)=[(f(x)+g(x)) \bmod K] \bmod M.$$

Since M is a factor of K, this becomes:

$$f'(x+1)=(f(x)+g(x)) \bmod M.$$

The definitions of f(x) and g(x) from Equations 6 and 7 can be substituted into the above equation to yield:

$$f'(x+1)=(f'(x)+Mf''(x)+g'(x)+Mg''(x)) \bmod M$$

but f''(x) and g''(x) are integers, so the above result reduces to:

$$f'(x+1)=(f'(x)+g'(x)) \bmod M.$$

Likewise, $$g'(x+1)=g(x+1) \bmod M$$

$$g'(x+1)=[(g(x)+2b) \bmod K] \bmod M$$

$$g'(x+1)=(g(x)+2b) \bmod M$$

$$g'(x+1)=(g(x) \bmod M + 2b \bmod M) \bmod M$$

$$g'(x+1)=(g'(x)+c') \bmod M$$

where $c'=(2b) \bmod M$.

Given that $f''(x+1)=\lfloor f(x+1)/M \rfloor$, we can substitute for $f(x+1)$ to obtain:

$$f''(x+1) = \lfloor [(f(x)+g(x)) \bmod K]/M \rfloor$$

$$f''(x+1) = \lfloor [(f'(x)+Mf''(x)+g'(x)+Mg''(x)) \bmod K]/M \rfloor$$

$$f''(x+1) = \lfloor (f'(x)+g'(x)+M(f''(x)+g''(x)))/M \rfloor \bmod \frac{K}{M}$$

$$f''(x+1) = \lfloor (f'(x)+g'(x))/M \rfloor \bmod P + (f''(x)+g''(x)) \bmod P$$

$$f''(x+1) = \lfloor (f'(x)+g'(x))/M \rfloor + (f''(x)+g''(x)) \bmod P$$

$$f''(x+1) = \begin{cases} (f''(x)+g''(x)) \bmod P & \text{if } f'(x)+g'(x) < M \\ 1+(f''(x)+g''(x)) \bmod P & \text{else} \end{cases}$$

Likewise, $$g''(x+1) = \lfloor g(x+1)/M \rfloor$$

$$g''(x+1) = \lfloor [(g(x)+2b) \bmod K]/M \rfloor$$

$$g''(x+1) = \begin{cases} (g''(x)+c'') \bmod P & \text{if } g'(x)+c' < M \\ 1+(g''(x)+c'') \bmod P & \text{else} \end{cases}$$

where $c''=\lfloor (2b)/M \rfloor$.

The quantities f''(x+1) and f'(x+1) are defined inductively. Therefore, x can be treated as a parameter that runs from 0 to M−1 along each row of array 50 as indicated by arrow 60 in FIG. 6, provided that the set of values f'(0), f''(0), g'(0) and g''(0) are given for the beginning of each row. These values can be calculated for all rows during the time it takes for the FPGA 10 to be loaded with the data block that is to be interleaved. It is appreciated that this loading action may be performed prior to the loading of data block in order to improve the speed of the turbo decoding. These values can be calculated by the configuration of FIG. 2 (which treats x as running from 0 to K−1 and does not utilize the array folding notion of FIGS. 4 to 6) and obtaining the values f(x) and g(x) for every instance where x satisfies x=nM, where n=0, 1, 2, 3, . . . , P−1. The set of values for the $n^{th}$ of these instances is the f(0) and the g(0) of the $n^{th}$ row of array 50. Then, f'(0), f''(0), g'(0) and g''(0) can be calculated by Equations 4, 5, 8 and 9 respectively.

Considering the $0^{th}$ row of the array 50, f(0)=0 and g(0)=(a+b) mod K and:

$$f'(0)=f(0) \bmod M = 0 \bmod M = 0$$

$$f''(0)=\lfloor f(0)/M \rfloor = \lfloor 0/M \rfloor = 0$$

$$g'(0)=[(a+b) \bmod K] \bmod M = (a+b) \bmod M \text{ (recall that } M \text{ is a factor of } K)$$

$$g''(0)=\lfloor g(0)/M \rfloor = \lfloor [(a+b) \bmod K]/M \rfloor.$$

The procedure for calculating f'(x+1), f''(x+1), g'(x+1) and g''(x+1) from f'(x), f''(x), g'(x) and g''(x) within a row of the array 50 will now be described.

Since f'(x) is smaller than M and since g'(x) smaller than M, it follows that f'(x)+g'(x) is smaller than 2M. So, f'(x+1) has one of the two following values:

$$f_1'(x+1)=f'(x)+g'(x) \quad \text{Equation 10}$$

$$f_2'(x+1)=f'(x)+g'(x)-M \quad \text{Equation 11.}$$

Since f''(x) is smaller than P and since g''(x) is smaller than P, it follows that f''(x)+g''(x) is smaller than 2P. So, one of the two following values is smaller than P:

$$f_1''(x+1)=f''(x)+g''(x) \quad \text{Equation 12}$$

$$f_2''(x+1)=f''(x)+g''(x)-P \quad \text{Equation 13.}$$

Since g'(x) is smaller than M and since c' is smaller than M, it follows that g'(x)+c' is smaller than 2M. So, one of the two following values is smaller than M:

$$g_1'(x+1)=g'(x)+c' \quad \text{Equation 14}$$

$$g_2'(x+1)=g'(x)+c'-M \quad \text{Equation 15.}$$

Since g''(x) is smaller than P and since c'' is smaller than P, it follows that g''(x)+c'' is smaller than 2P. So, g''(x+1) has one of the two following values:

$$g_1''(x+1)=g''(x)+c'' \quad \text{Equation 16}$$

$$g_2''(x+1)=g''(x)+c''-P \quad \text{Equation 17.}$$

Therefore, $$f'(x+1) = \begin{cases} f_1'(x+1) & \text{if } f_1'(x+1) < M \\ f_2'(x+1) & \text{else} \end{cases} \quad \text{Equation 18}$$

$$\text{Equation 19}$$

$$f''(x+1) = \begin{cases} f_1''(x+1) & \text{if } f_1''(x+1) < P \text{ and } f_1'(x+1) < M \\ f_1''(x+1)+1 & \text{if } f_1''(x+1) < P \text{ and } f_1'(x+1) \geq M \\ f_2''(x+1) & \text{if } f_1''(x+1) \geq P \text{ and } f_1'(x+1) < M \\ f_2''(x+1)+1 & \text{else} \end{cases}$$

$$g'(x+1) = \begin{cases} g'_1(x+1) & \text{if } g'_1(x+1) < M \\ g'_2(x+1) & \text{else} \end{cases} \quad \text{Equation 20}$$

$$g''(x+1) = \begin{cases} g''_1(x+1) & \text{if } g''_1(x+1) < P \text{ and } g'_1(x+1) < M \\ g''_1(x+1)+1 & \text{if } g''_1(x+1) < P \text{ and } g'_1(x+1) \geq M \\ g''_2(x+1) & \text{if } g''_1(x+1) \geq P \text{ and } g'_1(x+1) < M \\ g''_2(x+1)+1 & \text{else} \end{cases} \quad \text{Equation 21}$$

Equations 10 to 21 can be implemented within FPGA 10 to produce an interleaver for determining the location in terms of ordinate or row f"(x) and abscissa or column f'(x) co-ordinates within array 48 whose content is placed at position x of row n of array 50 (where row n is of course specified by the values assigned for f'(0), f"(0), g'(0) and g"(0)). However, the set of equations 10 to 21 can be modified to avoid, as before, delay associated with the occurrence of multiple arithmetic operations in series in a data path, in which case Equation 11 becomes:

$$f_2'(x+1) = f'(x) + g_M'(x) \quad \text{Equation 22.}$$

And the following definitions can be made:

$$g_3'(x+1) = g'(x) + c' - 2M$$

$$g_M' = \begin{cases} g_2'(x+1) & \text{if } g_2'(x+1) < M \\ g_3'(x+1) & \text{if } g_2'(x+1) \geq M. \end{cases}$$

Figure 7:
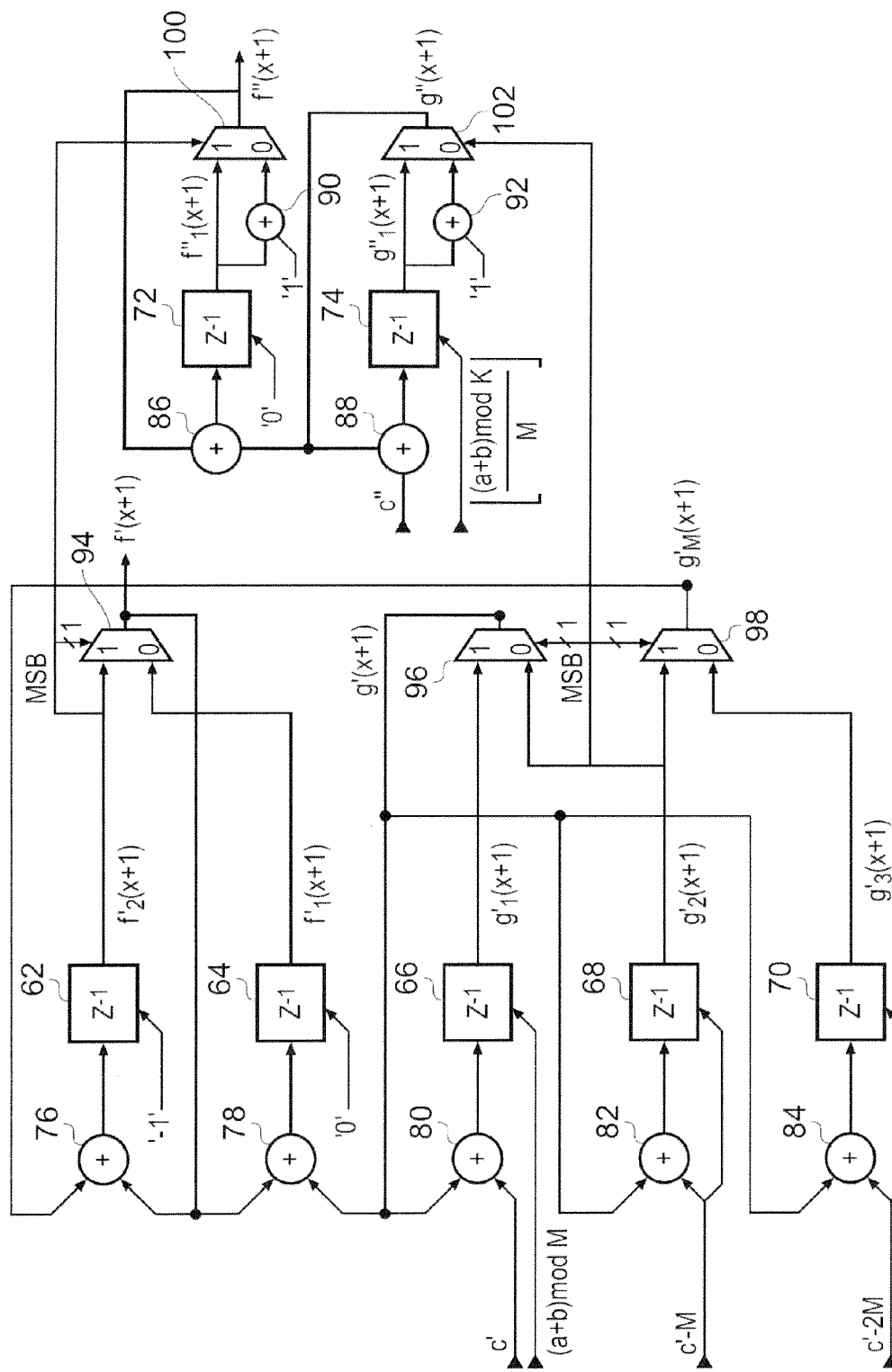
FIG. 7 illustrates an exemplary schematic associated with the hardware design of an interleaver implemented within the FPGA of FIG. 3 in accordance with one embodiment of the present invention.

The interleaver implementation for a row of array 50 is shown in FIG. 7. The circuit shown in that diagram comprises registers 62 to 74, adders 76 to 92 and multiplexers 94 to 102.

In the case where the interleaver design shown in FIG. 7 is being used to perform interleaving along the $0^{th}$ row of array 50, the registers 62 to 74 are initialized with the following values, respectively:

$$f_2'(0) = -1$$

$$f_1'(0) = 0$$

$$g_1'(0) = (a+b) \bmod M$$

$$g_2'(0) = c' - M$$

$$g_3'(0) = c' - 2M$$

$$f_1''(0) = 0$$

$$g_1''(0) = \lfloor [(a+b) \bmod KJ/M] \rfloor.$$

These initial values are loaded using the synchronous load inputs of the registers 62 to 74, as indicated by the inputs leading into the lower faces of the registers. If the design of FIG. 7 is to be used to implement interleaving for some other row of array 50 then a different set of initialization values will apply. It is appreciated that the different set of initialization values can be calculated in the period when the data to be interleaved is being loaded. Besides initialization inputs, the values c', c'−M, c'−2M and c" are provided to inputs of adders 80, 82, 84 and 88, respectively. Also one input of each of adders 90 and 92 is fixed with an input value of 1.

FIG. 7 will not be discussed in great detail here since its organisation is evident from the drawing itself. However, some salient features will be touched upon, as follows. The multiplexers 96, 98 and 102 are controlled by the MSB of the output of register 68. The multiplexers 94 and 100 are both controlled by the MSB of the output of register 62. The outputs of the multiplexers 94 to 102 are fed back into inputs of certain ones of the adders 76 to 88. The outputs f'(x+1) and f"(x+1) of the circuit are taken from multiplexers 94 and 100, respectively.

The circuit of FIG. 7 can be used to calculate f'(x+1), f"(x+1), g'(x+1) and g"(x+1) for a given value of x for all rows n=0 to P−1. This is done by initializing the relevant registers of the circuit on the basis of the f'(0), f"(0), g'(0) and g"(0) values of the desired row, 0 through P−1 (the calculation of these values was described earlier). Therefore P parallel versions of the FIG. 7 circuit can be provided, each serving the interleaving needs of a different, respective one of the P rows of array 50. Depending on the precise nature of the QPP algorithm involved, it can be the case that f'(x+1) is the same for all P interleavers, with the result that the circuitry associated with calculating f'(x+1) can be omitted from P−1 of the P versions of the FIG. 7 circuit, with the result that a significant saving in FPGA resources is obtained.

Figure 8:
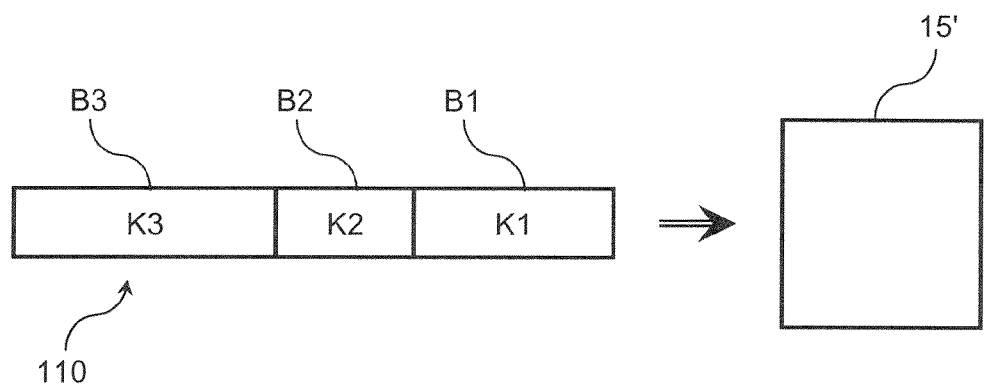
FIG. 8 shows an exemplary data stream of symbol blocks to be interleaved in accordance with one embodiment of the present invention.

As shown in FIG. 8, a data stream 110 comprises consecutive blocks of symbols (of which three, B1, B2 and B3 are shown) that are to be interleaved, for example, by the interleaver 15' in accordance with a QPP algorithm. In a typical QPP LTE interleaver application, the number of data symbols in the blocks B1, B2 and B3 typically has differing number of symbols. For example, the number of symbols in a block may vary between as few as thirty-six and as many as six thousand.

Figure 9:
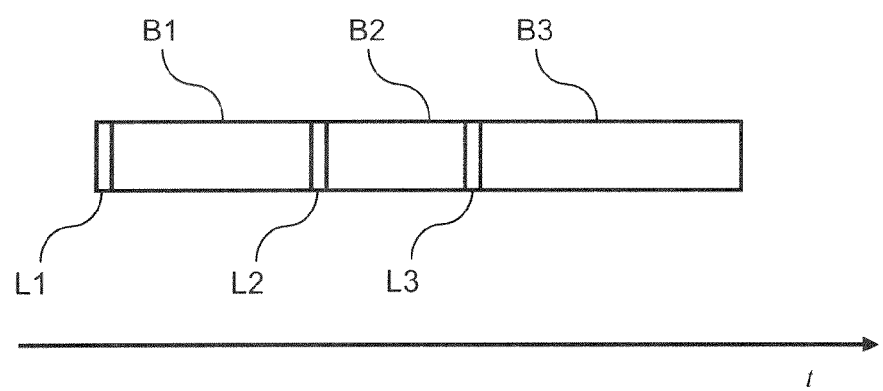
FIG. 9 illustrates an exemplary timing of an interleaver processing of the data stream of symbol blocks in FIG. 8 in accordance with one embodiment of the present invention.

Referring now to FIG. 9, when each block of symbols is applied to the interleaver for QPP interleaving as described above, the initial values of the various required parameters are supplied to the FPGA circuitry shown in FIG. 7 in order for that circuitry to produce iteratively the interleaved symbols. As discussed above, it will be understood that for each differently-sized block, B1, B2, B3, these required initial values may be different and typically are different. Further, although as described above the initial values of the required parameters can be calculated at the time of loading the data symbol values of the block for interleaving, there will typically be a delay before the calculation of the initial values is complete and the circuitry of FIG. 7 can begin to produce the interleaved symbols in accordance with one exemplary embodiment of the present invention. FIG. 9 illustrates an exemplary timeline along time axis t of one embodiment of interleaving processing of the blocks B1, B2 and B3, the amount of time needed for calculation of the initial values typically results in periods of latency L1, L2 and L3 before the interleaved symbols can be produced for each newly-sized block.

Figure 10:
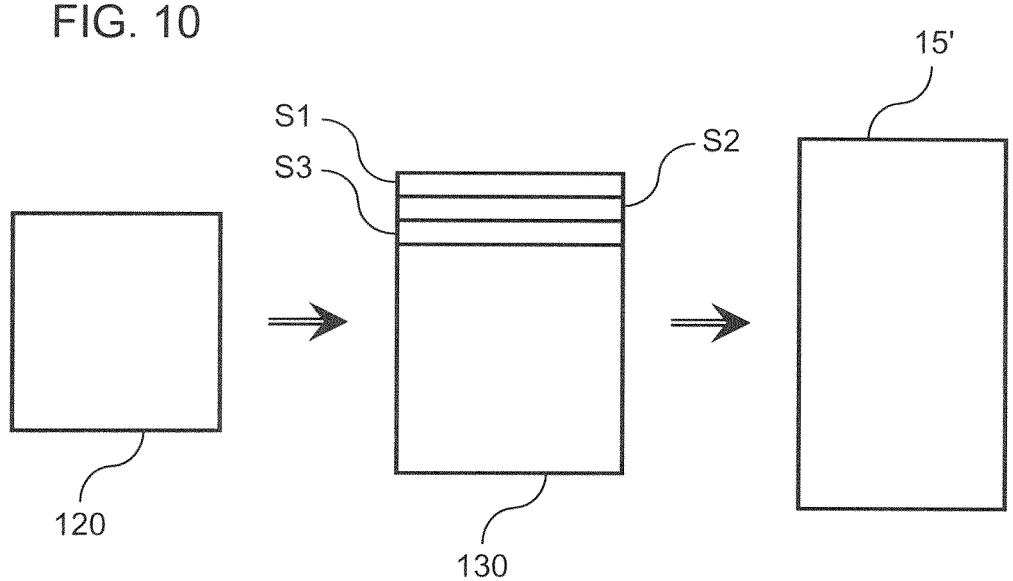
FIG. 10 shows an exemplary arrangement for interleaving of the symbol blocks in the data stream shown in FIG. 8 in accordance with one embodiment of the present invention.

In order to avoid these latency delays before the FPGA circuitry can produce the interleaved symbols, an arrangement such as shown in FIG. 10 can be used. In the arrangement of FIG. 10, a calculation device such as a computer 120 (which in addition to a general purpose computer may also be a dedicated circuitry or a programmable circuitry, e.g., an IC) is used to pre-calculate initial values, and to store these pre-calculated values in a memory (e.g., volatile memory such as random-access memory or RAM, or non-volatile memory such as read-only memory or ROM) 130. Initial values for at least some of the necessary parameters are pre-calculated and stored in the memory 130 for each possible value of K, thus producing a set of values S1, S2, S3, etc., stored in the memory 130 for each K value.

Thus, as shown in FIG. 10, for each value K, the initial values of the parameters which have been pre-calculated stored in the memory 130 are read out and applied to the FPGA circuitry of FIG. 7 when a new block in the data stream 110 is to be interleaved, the pre-calculated values read from the memory being those appropriate to the block size K (for example, K1, K2 or K3) to be interleaved.

Figure 11:
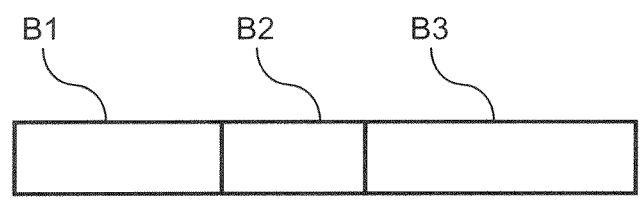
FIG. 11 illustrates an exemplary timing of an interleaver processing of the data stream of symbol blocks in FIG. 8 utilizing the arrangement of FIG. 10 in accordance with one embodiment of the present invention.

It will be understood that after one-time initial pre-calculation and storage of the initial values, the amount of time needed to read the values from the memory 130 and to apply them to the FPGA circuitry of FIG. 7 is not significant. Accordingly, pre-calculation and storage reduces the latency delays of FIG. 9, and provides (as shown in FIG. 11, which illustrates a timeline along time axis t of a second method of interleaving processing of the blocks B1, B2 and B3—compared with the first method illustrated in FIG. 9) effectively uninterrupted production of interleaved symbols between differing block sizes of symbols in an incoming data symbol stream. In one embodiment, the pre-calculation and storage substantially reduces or effectively eliminates the latency delays of FIG. 9.

Thus, pre-calculating and storing initial values overcomes the disadvantages of the method described earlier of calculating during the loading time which requires extra logic resources on an IC to calculate interleaver addresses sequentially and save the intermediate register values during the calculation and makes the parallelism of loading infeasible, which affects the overall system latency and throughput. This technique therefore provides the advantages that:

It does not limit the input loading time to K clock cycles. By paralyzing the loading, the overall LTE system latency and throughput can be improved;

There is no need to calculate interleaver addresses sequentially, which saves hardware resources;

It does not require extra logic resources to store values in an input buffer;

It allows the interleaver addresses to be calculated in a SISO decoder, so only a single buffer is needed, hence saving memory bits (in one embodiment, saving half the memory bits).

It makes the LTE Turbo decoder using the interleaver more effective in terms of hardware and performance.

It will be appreciated that, depending on the particular implementation, it may not be necessary to pre-calculate and store all of the required initial values as described above. In such cases it may be acceptable (keeping latency to an acceptably low level) to pre-calculate and store only some of the required initial values, while allowing others to be calculated at load-time as earlier described above. Below there will discussed four different implementations of LTE Turbo QPP interleaver: (i) hardware implementation of an LTE Turbo QPP interleaver for a single processing engine case, (ii) hardware-optimized implementation for a single processing engine case, (iii) hardware implementation of an LTE Turbo QPP interleaver for a multiple processing engine case, and (iv) hardware-optimized implementation of an LTE Turbo QPP interleaver for a multiple processing engine case.

Assuming that there are P parallel engines, then for P−1 locations, the register values are unknown. These register values are dependent on the block size K. It can be proved that for each block size:

6 register values are related to the values of K and P mathematically so they can be calculated in hardware once the block data is available;

2(P−1) register values of much smaller width do not have simple equations in K and P, so are calculated offline and stored in ROM, for instance;

The stored values are loaded in an SISO decoder, so multiple interleaver addresses can be calculated in parallel;

(i) As discussed above, in one embodiment of a hardware implementation of an LTE Turbo QPP interleaver for a single engine case, initialization involves calculating f(0)=0, g(0)=(a+b)mod K, c=(2*b)mod K, and f(x+1), g(x+1) as described above. Thus, for each LTE supported block size K, g(0) and c can be calculated during compile time and stored in RAM/ROM (there being no need to pre-calculate f(0) since its value is known to be zero). Therefore no hardware resource is required for the initialization.

(ii) In one embodiment of a hardware-optimized implementation for a single engine case, one aim for hardware optimization is to increase the operating frequency of the interleaver. Operation of one embodiment of such an interleaver may be analyzed as follows:

Initialization:

$f_1(x)=0, f_2(x)=-1, g_1(x)=(a+b) \bmod K, g_2(x)+(c-K) \bmod K, g_3(x)=(c-2K) \bmod K$ These values are loaded using the synchronous load input of the registers (although there is no need to pre-calculate $f_1(0)$ or $f_2(x)$ since their values are known).

$f_2(x+1)$ is modified. $g_3(x+1)$ and $g_K(x+1)$ are added.

Given that f(x) and g(x) are each smaller than K, the following steps are applied to calculate f(x+1) and g(x+1) (the resulting f(x+1), g(x+1) are smaller than K too):

Calculate the following values $$f_1(x+1)=f(x)+g(x)$$

$$f_2(x+1)=f(x)+g_K(x)$$

$$g_1(x+1)=g(x)+c$$

$$g_2(x+1)=g(x)+c-K$$

$$g_3(x+1)=g(x)+c-2K$$

Since f(x)<K, g(x)<K, c<K, therefore either $f_1(x+1)$ or $f_2(x+1)$ is smaller than K; either $g_1(x+1)$ or $g_2(x+1)$ is smaller than K;

$$f(x+1) = \begin{cases} f_1(x+1) & \text{if } f_1(x+1) < K \\ f_2(x+1) & \text{else} \end{cases}$$

$$g(x+1) = \begin{cases} g_1(x+1) & \text{if } g_1(x+1) < K \\ g_1(x+1) & \text{else} \end{cases}$$

$$g_K(x+1) = \begin{cases} g_2(x+1) & \text{if } g_2(x+1) < K \\ g_3(x+1) & \text{if } g_2(x+1) \geq K \end{cases}$$

In one embodiment, for each LTE supported block size K, g(0) and c are calculated during compile time and stored in ROM. Accordingly, the amount of hardware resources required for the initialization is reduced. Moreover, c−K and c−2K are calculated outside the interleaver and supplied to the interleaver as registered inputs.

This implementation reduces the length of the combinatorial path while performing more calculations in parallel resulting in superior operating frequency. Performance result comparisons between the standard hardware implementation and the optimized hardware implementation display the difference in resource usage.

(iii) In a hardware implementation of an LTE Turbo QPP interleaver for a multiple engine case, the interleaver operates according to the following analysis:

Given block size K, the number of parallel engines P, M=K/P;

$f(x)=f'(x)+M \cdot f''(x), g(x)=g'(x)+M \cdot g''(x)$

Initialization:

$f'(0)=0, f''(0)=0, g'(0)=(a+b) \bmod M, g''(0)=\lfloor (a+b)/M \rfloor, c'=(2b) \bmod M, c''=\lfloor (2b)/M \rfloor$. Similarly to above, there is no need to pre-calculate f'(0) or f"(0) since their values are known to be zero.

Given f'(x), g'(x) are smaller than M, f"(x), g"(x) are smaller than P, the following steps are applied to calculate f'(x+1), g'(x+1) and f"(x+1), g"(x+1) (the resulting f'(x+1), g'(x+1) are smaller than M and f"(x+1), g"(x+1) are smaller than P);

Calculate the following values $$f_1'(x+1) = f'(x) + g'(x)$$

$$f_2'(x+1) = f'(x) + g'(x) - M$$

$$f_1''(x+1) = f''(x) + g''(x)$$

$$f_2''(x+1) = f''(x) + g''(x) - P$$

$$g_1'(x+1) = g'(x) + c'$$

$$g_2'(x+1) = g'(x) + c' - M$$

$$g_1''(x+1) = g''(x) + c''$$

$$g_2''(x+1) = g''(x) + c'' - P$$

$$f'(x+1) = \begin{cases} f_1'(x+1) & \text{if } f_1'(x+1) < M \\ f_2'(x+1) & \text{else} \end{cases}$$

$$f''(x+1) = \begin{cases} f_1''(x+1) & \text{if } f_1''(x+1) < P \text{ and } f_1'(x+1) < M \\ f_1''(x+1)+1 & \text{if } f_1''(x+1) < P \text{ and } f_1'(x+1) \geq M \\ f_2''(x+1) & \text{if } f_1''(x+1) \geq P \text{ and } f_1'(x+1) < M \\ f_2''(x+1)+1 & \text{else} \end{cases}$$

$$g'(x+1) = \begin{cases} g_1'(x+1) & \text{if } g_1'(x+1) < M \\ g_2'(x+1) & \text{else} \end{cases}$$

$$g''(x+1) = \begin{cases} g_1''(x+1) & \text{if } g_1''(x+1) < P \text{ and } g_1'(x+1) < M \\ g_1''(x+1)+1 & \text{if } g_1''(x+1) < P \text{ and } g_1'(x+1) \geq M \\ g_2''(x+1) & \text{if } g_1''(x+1) \geq P \text{ and } g_1'(x+1) < M \\ g_2''(x+1)+1 & \text{if else} \end{cases}$$

f'(x), f"(x) are referred as column addresses and row addresses respectively;

Once f'(x), g'(x) and f"(x), g"(x) are ready the next values f'(x+1), g'(x+1) and f"(x+1), g"(x+1) can be calculated using the procedures above;

For the multiple engine case, one block is segmented equally to P sub-blocks (in one embodiment, all LTE block sizes being divisible by 8). In one embodiment, for the first sub-block, values calculated in the initialization step are used. For the other P−1 sub-blocks, the values at the beginning of the sub-blocks are calculated in software and stored into ROM, which are retrieved at decoding time. Therefore, the decoding process can be started in a timely fashion (in one embodiment, instantly);

In one embodiment, as the decoding process for each engine is synchronized, the column addresses for each engine will be the same. Therefore, in such an embodiment, only one interleaver is needed to calculate both column addresses and row addresses. This approach can lead to a saving of logic resources used for LTE QPP interleavers up to 60% for 8 engine case;

(iv) In one embodiment, for hardware optimized implementation, the mathematical formulation can be modified similarly to the single engine version:

Modify $f_2'(x+1)$ to become:

$$f_2'(x+1) = f'(x) + g_M'(x)$$

Define:

$$g_3'(x+1) = g'(x) + c' - 2M \text{ and}$$

$$g_M'(x+1) = \begin{cases} g_2'(x+1) & \text{if } g_2'(x+1) < M \\ g_3'(x+1) & \text{if } g_2'(x+1) \geq M \end{cases}$$

Initialization:
$f_1'=0$, $g_1'(x)=(a+b) \bmod M$, $f_2'(x)=-1$, $g_2'(x)=(c-M) \bmod M$, $g_3'(x)=(c-2M) \bmod M$, $f_1''(x)=0$, $g_1''(x)=0$, $g_1''(x)=\lfloor(a+b)/M\rfloor$. Similarly to above, there is no need to pre-calculate $f_1'(x)$ or $f_1''(x)$ since their values are known to be zero.

To the person of ordinary skill in the art, the optimized hardware implementation of the multiple engine version of the interleaver will be straightforward when the mathematical expressions are implemented in a similar way to the single engine version.

By definition, $f(x)=f'(x)+M \cdot f''(x)$. $g(x)=g'(x)+M \cdot g''(x)$, where $f'(x)=f(x) \bmod M$, $f''(x)=\lfloor f(x)/M \rfloor$ and $g'(x)=g(x) \bmod M$, $g''(x)=\lfloor g(x)/M \rfloor$.

The starting indices of the sub-blocks are 0, M, 2M, ..., (P−1)M. Then f'(iM)=f(iM)mod M
={[a·iM+b·(iM)²]mod K}mod M
={[a·iM+b·(iM)²]mod M}mod K
=0

Since in the hardware implementation of parallel interleaver for multiple engine case, $f_1'(x)$ and $f_2'(x)$ are calculated to avoid the MOD operation. It has been confirmed that $f_1'(iM)=M$ for i=1, ..., P−1, while $f_2'(iM)=0$ for i=1, ..., P−1. Therefore, in such an implementation, those values can be loaded during interleaver initialization without the need to store in the memory or calculate during the loading time.

In one embodiment, the intermediate values of $f_1''(iM)$ for i=1, ..., P−1 are calculated offline and stored in ROM. During initialization time of the interleaver, $f_2''(iM)$ can be calculated accordingly.

Similarly for g'(x), we have g'(iM)=g(iM)mod M
={[a+b+2b·(iM)]mod K}mod M
={[a+b+2b·(iM)]mod M}mod K
=(a+b)mod M In the hardware implementation, $g_1'(x)$, $g_2'(x)$ and $g_3'(x)$ rather than g'(x) are calculated instead to avoid the MOD operation. For each block size K, $g_1'(iM)$ is either (a+b)mod M or (a+b)mod M+M for i=1, ..., P−1. Therefore one bit can be stored indicating the situation which is calculated offline and stored in ROM. In the interleaver initialization time, the one bit information is loaded and hence $g_1'(iM)$, $g_2'(iM)$ and $g_3'(iM)$ can be calculated accordingly.

Similarly the intermediate values of $g_1'(iM)$ for i=1, ..., P−1 have to be calculated offline and stored in ROM. During initialization time of the interleaver $g_2'(iM)$ and $g_3'(iM)$ can be calculated accordingly.

Since, in one embodiment, the intermediate values of sub-block interleaver are either stored in ROM or calculated during initialization time, there is no need to use the loading time for interleaver initialization as described earlier above. Therefore, interleaver address calculation is no longer dependent on the input loading.

It will be appreciated that, although the technique utilizing pre-calculation and storage of initial values has been described above in relation LTE Turbo QPP interleaving, it need not be limited to such applications, and could alternatively be applied to other types of interleaving (the parameters best suited for initial value pre-calculation being a matter for design choice of the person of ordinary skill in the art depending on a various design possibilities and performance considerations).

In at least one embodiment, the data interleaved by an interleaver or method of the present invention represent communication signals that are produced or received by a communication device. In one embodiment, the data represents demodulated RF communication signals that are demodulated from RF communication signals received by a base station. It is to be noted that "representing communication signals" is herein used broadly to refer to both representing either the communication signals that are actually transmitted or some other signals derived therefrom (e.g., signals that are modulated or demodulated versions of the actually transmitted communication signals).

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of interleaving a set of data items from an original order to an interleaved order, the method comprising:
calculating in advance an initial value of at least one parameter for use by logic circuitry to initialize interleaving operation;
storing the initial value of the at least one parameter as a stored initial value of the at least one parameter; and
using the stored initial value of the at least one parameter with the logic circuitry to generate interleaved order positions for the set of data items,
wherein the logic circuitry comprises a quadratic permutation polynomial (QPP) interleaver,
wherein the logic circuitry comprises a single processing engine and the at least one parameter comprises a first parameter having a value represented by (a+b)mod K and a second parameter having a value represented by (2b)mod K, where K represents block size in the set of data items, and a and b represent coefficients of a QPP determining the interleaved order from the original order.

2. The method of claim 1, wherein the at least one parameter comprises a plurality of parameters for a plurality of respective block sizes of the set of data items.

3. The method of claim 1, wherein the logic circuitry further comprises registered inputs receiving a third parameter value represented by c−K and a fourth parameter value represented by c−2K, where c represents (2b)mod K.

4. The method of claim 1, wherein the logic circuitry comprises a plurality of processing engines whose operation is synchronized, wherein the set of data items can be visualized as a rectangular array of data items with rows and columns, and the logic circuitry comprises a single logic assembly arranged to calculate column addresses and row addresses.

5. The method of claim 1, wherein the logic circuitry comprises a Single-Input and Single-Output (SISO) decoder.

6. A method of interleaving a set of data items from an original order to an interleaved order, the method comprising:
calculating in advance an initial value of at least one parameter for use by logic circuitry to initialize interleaving operation;
storing the initial value of the at least one parameter as a stored initial value of the at least one parameter; and
using the stored initial value of the at least one parameter with the logic circuitry to generate interleaved order positions for the set of data items,
wherein the logic circuitry comprises a quadratic permutation polynomial (QPP) interleaver,
wherein the QPP interleaver comprises a plurality of processing engines and the at least one parameter comprises a first parameter having a value represented by (a+b) mod M, a second parameter having a value represented by $\lfloor(a+b)/M\rfloor$, a third parameter having a value represented by (2b)mod M, and a fourth parameter having a value represented by $\lfloor(2b)/M\rfloor$, where a and b represent coefficients of a QPP determining the interleaved order from the original order, and M represents length of sections into which the set of data items is divided for processing by the plurality of engines, and $\lfloor\ \rfloor$ denotes floor function.

7. A method of interleaving a set of data items from an original order to an interleaved order, the method comprising:
calculating in advance an initial value of at least one parameter for use by logic circuitry to initialize interleaving operation;
storing the initial value of the at least one parameter as a stored initial value of the at least one parameter; and
using the stored initial value of the at least one parameter with the logic circuitry to generate interleaved order positions for the set of data items,
wherein the logic circuitry comprises a quadratic permutation polynomial (QPP) interleaver,
wherein the logic circuitry comprises a plurality of processing engines and the at least one parameter comprises a first parameter having a value represented by (a+b) mod M, (c−M)mod M, (c−2M)mod M, $\lfloor(a+b)/M\rfloor$, where a and b represent coefficients of a QPP determining the interleaved order from the original order, and M represents length of sections into which the set of data items is divided for processing by the plurality of engines, and $\lfloor\ \rfloor$ denotes floor function.

8. A method of interleaving a series of K data items from an original order to an interleaved order, the method comprising:
calculating from which position in the original order should be provided a data item for a current position in the interleaved order;
wherein:
the series of K data items represents communication signals, where K is an integer;
the position in the original order is specified by a first function, wherein the first function is a function of the current position in the interleaved order;
a basis of the first function is a sum of two variable values each of the two variable values being less than K;
a first variable value of the two variable values is a value of the first function when an argument of the first function is a preceding position in the interleaved order;

a second variable value of the two variable values is a value of an auxiliary function when an argument of the auxiliary function is the preceding position in the interleaved order; and the method further comprises:
storing an initial value of at least one parameter as a stored initial value of the at least one parameter;
using the stored initial value of the at least one parameter to initialize interleaving operation;
calculating a first sum, wherein the first sum is a sum of the first variable value and a first constant;
calculating a second sum, wherein the second sum is a sum of the second variable value and a second constant; and
using the first and second sums to calculate a value for the auxiliary function when the argument of the auxiliary function is the current position in the interleaved order;
wherein the first and second sums are calculated in parallel by logic circuitry.

9. An interleaver for interleaving a set of data items from an original order to an interleaved order, wherein the interleaver comprises:
logic circuitry for generating interleaved order positions for the set of data items, and
memory coupled to the logic circuitry for holding an initial value of at least one parameter for use by the logic circuitry to initialize interleaving operation,
wherein the interleaver is a quadratic permutation polynomial (QPP) interleaver,
wherein the interleaver comprises a single processing engine and the at least one parameter comprises a first parameter having a value represented by (a+b)mod K and a second parameter having a value represented by (2b)mod K, where K represents block size in the set of data items, and a and b represent coefficients of a QPP determining the interleaved order from the original order.

10. The interleaver of claim 9, wherein the at least one parameter comprises a plurality of parameters for a plurality of respective block sizes of the set of data items.

11. The interleaver of claim 9, wherein the interleaver further comprises registered inputs arranged to receive a third parameter value represented by c−K and a fourth parameter value represented by c−2K, where c represents (2b)mod K.

12. The interleaver of claim 9, wherein the interleaver comprises a plurality of processing engines whose operation is synchronized, the set of data items can be visualized respectively as a rectangular array of data items with rows and columns, and the interleaver comprises a single logic assembly arranged to calculate both column addresses and row addresses.

13. The interleaver of claim 9, wherein the interleaver comprises a Single-Input and Single-Output (SISO) decoder.

14. An interleaver for interleaving a set of data items from an original order to an interleaved order, wherein the interleaver comprises:
logic circuitry for generating interleaved order positions for the set of data items, and
memory coupled to the logic circuitry for holding an initial value of at least one parameter for use by the logic circuitry to initialize interleaving operation,
wherein the interleaver is a quadratic permutation polynomial (QPP) interleaver, wherein the interleaver comprises a plurality of processing engines and the at least one parameter comprises a first parameter having a value represented by (a+b)mod M, a second parameter having a value represented by $\lfloor (a+b)/M \rfloor$, a third parameter having a value represented by (2b)mod M, and a fourth parameter having a value represented by $\lfloor (2b)/M \rfloor$, where a and b represent coefficients of a QPP determining the interleaved order from the original order, and M represents length of sections into which the set of data items is divided for processing by the plurality of engines, and $\lfloor \ \rfloor$ denotes floor function.

15. An interleaver for interleaving a set of data items from an original order to an interleaved order, wherein the interleaver comprises:
logic circuitry for generating interleaved order positions for the set of data items, and
memory coupled to the logic circuitry for holding an initial value of at least one parameter for use by the logic circuitry to initialize interleaving operation,
wherein the interleaver is a quadratic permutation polynomial (QPP) interleaver,
wherein the interleaver comprises a plurality of processing engines and the at least one parameter comprises a first parameter having a value represented by (a+b)mod M, (c−M)mod M, (c−2M)mod M, $\lfloor (a+b)/M \rfloor$, where a and b represent coefficients of a QPP determining the interleaved order from the original order, and M represents length of sections into which the set of data items is divided for processing by the plurality of engines, and $\lfloor \ \rfloor$ denotes floor function.

16. An interleaver for interleaving a series of K data items from an original order to an interleaved order, wherein:
the interleaver is arranged to calculate from which position in the original order should be provided a data item for a current position in the interleaved order;
the position in the original order is specified by a first function, wherein the first function is a function of the current position in the interleaved order;
the basis of the first function is a sum of two variable values, each variable value of the two variable values being less than K;
a first variable value of the two variable values is a value of the first function when an argument of the first function is a preceding position in the interleaved order;
a second variable value of the two variable values is a value of an auxiliary function when an argument of the auxiliary function is the preceding position in the interleaved order; and
the interleaver comprises:
memory for holding an initial value of at least one parameter for use to initialize interleaving operation;
first logic circuitry arranged to calculate a first sum, wherein the first sum is a sum of the first variable value and a first constant;
second logic circuitry arranged to calculate a second sum, wherein the second sum is a sum of the second variable value and a second constant; and
third logic circuitry arranged to use the first and second sums to calculate a value for the auxiliary function when the argument of the auxiliary function is the current position in the interleaved order;
wherein the first and second logic circuitry are arranged to operate in parallel.

* * * * *